(12) United States Patent
Waller, Jr.

(10) Patent No.: US 9,510,116 B2
(45) Date of Patent: Nov. 29, 2016

(54) HIGH DEFINITION DISTRIBUTED SOUND SYSTEM

(75) Inventor: James K. Waller, Jr., Clarkston, MI (US)

(73) Assignee: ISP Technologies, LLC

( * ) Notice: Subject to any disclaimer, the term of this patent is extended or adjusted under 35 U.S.C. 154(b) by 1243 days.

(21) Appl. No.: 13/155,163

(22) Filed: Jun. 7, 2011

(65) Prior Publication Data

US 2011/0311072 A1 Dec. 22, 2011

Related U.S. Application Data

(60) Provisional application No. 61/352,684, filed on Jun. 8, 2010.

(51) Int. Cl.
*H04R 27/00* (2006.01)
*H03G 1/02* (2006.01)
*H04R 5/02* (2006.01)

(52) U.S. Cl.
CPC .............. *H04R 27/00* (2013.01); *H03G 1/02* (2013.01); *H04R 5/02* (2013.01); *H04R 2227/005* (2013.01)

(58) Field of Classification Search
CPC ............ H04R 27/00; H04R 2227/003; H04R 2227/005; H04R 3/12; H04R 5/02; H04R 5/04; H03G 1/02
USPC ................................ 381/77, 80, 82, 104, 105
See application file for complete search history.

(56) References Cited

U.S. PATENT DOCUMENTS 3,714,462 A 1/1973 Blackmer
4,979,217 A * 12/1990 Shipley ......................... 381/81
6,389,139 B1 * 5/2002 Curtis et al. ................. 381/105
6,611,537 B1 * 8/2003 Edens et al. ................. 370/503
6,831,514 B2 12/2004 Waller, Jr. et al.
7,181,023 B1 2/2007 Andrews et al.
7,756,277 B2 * 7/2010 Andrews et al. ............... 381/77
2003/0220705 A1 * 11/2003 Ibey ............................. 700/94
2005/0047608 A1 * 3/2005 Araya et al. ................... 381/63

(Continued)

FOREIGN PATENT DOCUMENTS

EP 1 517 464 A2 3/2005

OTHER PUBLICATIONS

Tripath Technology Inc., "TA2020-020 Stereo 20W Class-T Digital Audio Amplifier Driver Using Digital Power Processing (DPP) Technology", Jan. 2001, Tripath Technology, Rev 5.0, pp. 1-14.*

*Primary Examiner* — Davetta W Goins
*Assistant Examiner* — Daniel Sellers
(74) *Attorney, Agent, or Firm* — Frank J. Catalano; Gable Gotwals

(57) ABSTRACT

A high definition distributed sound system has a master control hub with multiple serially linkable zones each capable of handling multiple serial arrays of powered speakers and a Cat5 cable. Each zone has an audio input, an internal master level controller and multiple powered-speaker outputs. Each of the serial arrays of powered speakers are connected to a corresponding powered-speaker output by the Cat5 cable. All of the zones can be used and controlled independently of the others or any number of them can be serially linked and controlled by their preceding zones. Additional master control hubs can be serially linked in a single system. The system interconnections can be done with Cat5 cable using RJ45 connectors. A low idle current power amplifier circuit offers extremely low levels of quiescent current, allowing a large number of speakers to be connected in one system.

16 Claims, 19 Drawing Sheets

(56) References Cited

U.S. PATENT DOCUMENTS

| | | |
|---|---|---|
| 2006/0126862 A1* | 6/2006 | Andrews et al. ............... 381/77 |
| 2006/0222153 A1 | 10/2006 | Tarkoff et al. |
| 2007/0071266 A1* | 3/2007 | Little et al. ................... 381/328 |
| 2007/0223722 A1 | 9/2007 | Merrey et al. |
| 2009/0232326 A1* | 9/2009 | Gordon et al. ................. 381/81 |
| 2010/0284389 A1* | 11/2010 | Ramsay et al. ................ 370/338 |
| 2010/0316237 A1* | 12/2010 | Elberbaum ................... 381/300 |

* cited by examiner

HIGH DEFINITION DISTRIBUTED SOUND SYSTEM

CROSS-REFERENCE TO PENDING APPLICATION

This is a utility patent application which claims priority to U.S. Provisional Patent Application No. 61/352,684 which was filed Jun. 8, 2010.

BACKGROUND OF THE INVENTION

This invention relates generally to audio systems and more particularly concerns distributed audio systems for audio announcement and background music.

Distributed audio systems for audio announcement and background music are very common in airports, hotels, restaurants, shopping centers, office buildings and many other commercial buildings. For many years the common distributed sound system has used 70 or 100 volt audio systems whereby the driving power amplifier output drives the audio signal through a matching transformer and each speaker in the system also incorporates additional matching transformers allowing a large number of speakers to be installed within a given system. The system power in a 70 volt system will be reduced by losses due to cable length, transformer loss and numerous other contributing factors. These systems are limited in total output power such that the total system power cannot exceed the maximum output power of the driving power amplifier plus the typical system losses. Once the systems power amplifiers maximum output power is met additional power amplifiers are required in order to add additional speakers into the system.

One of the largest drawbacks to the typical 70 volt distributed audio systems is the audio quality. The typical distributed sound system has greatly reduced audio fidelity and clarity. Most applications of distributed audio systems require multiple zones whereby the level of each zone can be adjusted at a master point in the system and also allow adjustment of the zone level in a remote location, typically somewhere within in the zone. Adding a remote zone level control requires an expensive power attenuator which, in many systems, can easily be overloaded, increasing distortion and further reducing the fidelity of the system.

Attempts to provide improved audio performance distributed audio systems have thus far been relatively complex and expensive. One proposed system, for example, improves audio with powered speakers connected over Cat5 cable but requires on board digital signal processing (DSP) and digital-to-analog converters at each speaker. While it is desirable to offer powered speakers for improved audio and to use Cat5 cable due to the lower cost of Cat5 wire, the proposed system has several drawbacks due to the limitations of current that can be passed over Cat5 wire. The proposed system feeds low voltage DC power down a pair of the Cat5 cable wires, which results in a large voltage drop over distance due to the small gauge of the Cat5 wire. Using on board DSP and digital-to-analog converters together with power amplifiers at each speaker requires a large amount of quiescent current which becomes the base line power before audio amplification. Amplifying the audio signal to a typical level means that the total power consumption per speaker becomes excessive. Therefore, an expander power converter is required in order to increase the number of speakers to a useful level, increasing the cost and complexity of the proposed system.

It is, therefore, an object of the present invention to provide a low cost high definition distributed sound system. Another object of the invention is to provide a high definition distributed sound system having improved sonic performance in relation to previously known systems. A further object of the invention is to provide a high definition distributed sound system which permits master, remote zone and individual speaker level controls. Yet another object of the invention is to provide an easily expandable high definition distributed sound system. Still another object of the invention is to provide a high definition distributed sound system which permits incorporation of useful numbers of speakers without enhancement of the power within the interconnected speakers. Another object of the invention is to provide a high definition distributed sound system with reduced base line system power requirements. A further object of the invention is to provide a high definition distributed sound system which applies higher ratios of power consumed to drive its speakers. Still another object of the invention is to provide a high definition distributed sound system which operates within the maximum allowable low voltage AC that can be distributed in commercial applications.

SUMMARY OF THE INVENTION

In accordance with the invention, a High Definition Distributed Sound System with active powered speakers is connected over low cost Cat5 cable to a Master Control Hub. The active powered speakers allow precision crossover and equalization at each speaker. The Master Control Hub allows multiple zone control with both master zone level and very low cost remote zone level control. The Master Control Hub further includes a link output and link input allowing easy expandability of the High Definition Distributed Sound System to virtually any size by adding other Master Control Hubs to the system. Furthermore, each zone in the Master Control Hub can be linked to allow the previous zone to control the level of the next zone in the Master Control Hub. The Master Control Hub has multiple outputs per zone which allows a large number of speakers per zone. Each zone output is connected via an RJ45 connector that feeds AC power down 3 pair of the Cat5 cable thereby decreasing the voltage drop per foot that would otherwise be a problem. Audio is fed differentially down the remaining twisted pair wire at a high level and received by a precision differential amplifier and then attenuated before amplification so as to eliminate the noise intrusion that would otherwise occur due to feeding AC power down the 3 twisted pair. In the preferred embodiment, the active powered speakers convert the low voltage AC power to a regulated bipolar DC voltage to power the internal active electronics including two power amplifiers, one for driving a woofer and one to drive a tweeter, in a bi-amplified configuration. The powered speakers further include a novel power amplifier design that consumes extremely low quiescent current thereby allowing the system to power several active speakers on each run of Cat5 cable.

BRIEF DESCRIPTION OF THE DRAWINGS

Other objects and advantages of the invention will become apparent upon reading the following detailed description and upon reference to the drawings in which.

While the invention will be described in connection with a preferred embodiment thereof, it will be understood that it is not intended to limit the invention to that embodiment or to the details of the construction or arrangement parts illustrated in the accompanying drawings.

DETAILED DESCRIPTION

Figure 1:
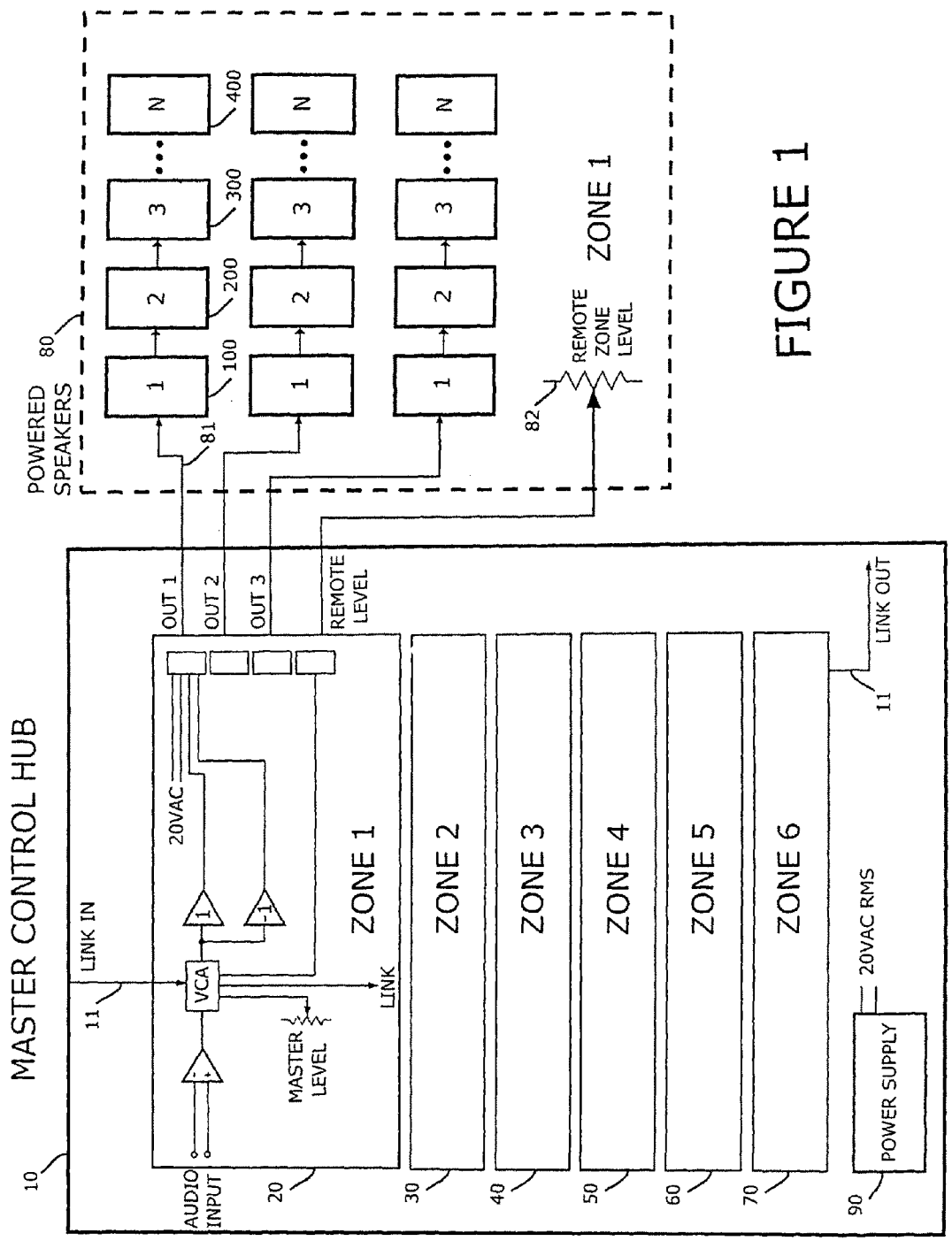
FIG. 1 is a partial block diagram, partial schematic diagram of a preferred embodiment of the invention.

Referring to FIG. 1, a generalized schematic/block diagram of a preferred embodiment of the invention is shown including a Master Control Hub 10 and in dashed block 80, multiple powered speakers connected via Cat5 cable to the outputs of zone 1. Master Control Hub 10 includes six separate zones 20, 30, 40, 50, 60 and 70. Each of the six zones contained in the Master Control Hub has an external connection to allow connection to a balanced audio source. Many manufacturers offer a front end processor that will allow selection of several audio sources and would typically be connected to the audio inputs of the zones. Each of the six zones offers multiple outputs typically including the common RJ45 connector used with Cat5 connections. Category 5 cable consists of 4 twisted pair 24-gauge wire that has been used for telephone and computer networking for years. Due to the large number of applications for Cat5 cable it has become extremely cost effective. As a result it offers a benefit of both low cost and ease of connection with RJ45 connectors if used with the current invention.

Figure 2:
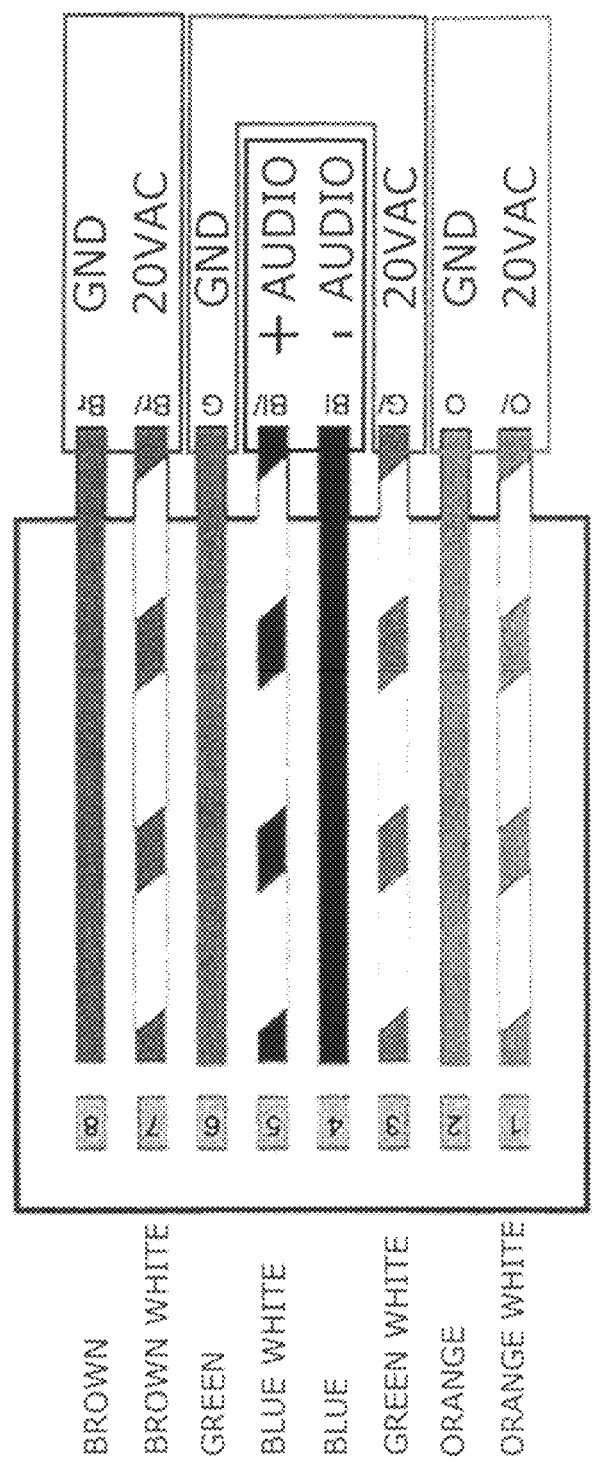
FIG. 2 is a diagram showing the typical connections for use of Cat5 wire between the Master Control Hub and the powered speakers.

In the preferred embodiment, each of the multiple zone outputs connect via RJ45 connectors as shown in FIG. 2 and 20 VAC power is distributed over 3 of the 4 twisted pair in the Cat5 cable. FIG. 2 also shows that the remaining twisted pair is used for distributing balanced audio between the Master Control Hub and the powered speakers.

Referring again to FIG. 1, internal power supply 90 converts the input 120/240 VAC to 20 VAC RMS which then connects to each of the multiple zone outputs in each zone of the Master Control Hub. 20 VAC RMS was selected in part due to the fact that it is considered extremely low voltage and should be under the typical building code requirements for distributing low voltage within commercial buildings. The 20 VAC RMS is rectified and filtered in each powered speaker so as to provide regulated +/−15 VDC to power the internal circuitry. Each of the six zones has a link control that allows each of the following zones to track or be controlled by the master level and remote level control of the preceding zone. Master Control Hub 10 also includes a Link In 11 that accepts a link control signal from a preceding Master Control Hub. Zone 6 shown as block 70 also includes a Link Out that can be connected to another Master Control Hub allowing an endless number of Master Control Hubs to be connected for extremely large distributed audio sound systems. It thus becomes clear that in large systems, Multiple Master Control Hubs can be used with all of the zones linked and a single master level control and a single remote zone control from the first Master Control Hub which will then allow control of all subsequent zones in the system.

All of the zone level controls and remote zone level controls in the system are generated with a DC control voltage controlling a VCA (Voltage Controlled Amplifier) thus allowing long runs of remote cable, again typically done with Cat5 cable, without any concern for audible noise pickup and further allowing a simple low cost potentiometer to be installed at the remote level control location. Voltage Controlled Amplifiers are commonly known by the skilled artisan and therefore the VCA will be shown in simple block form. This is a major advantage over the prior art 70 volt distributed systems which require an expensive power attenuator to be installed in the zone.

Referring again to FIG. 1, block 80, several speakers can be series connected on one run of Cat5 cable without any need for additional power or external power boosters. Block 80, Speaker Zone 1 shows Cat5 cable 81 connecting between the output 1 of Zone 1, 20 in the Master Control Hub to a first powered speaker 100. Each powered speaker includes an RJ45 connector for input and output allowing for connection to additional powered speakers 200, 300, and final powered speaker 400. As mentioned previously, the typical system will allow 10 or more speakers to be series connected on a single run of Cat5 cable. The limiting factor will be the maximum SPL (Sound Pressure Level) desired from the zone. With low level background music, the current consumption of each speaker will be low, allowing a larger number of speakers per run of Cat5 cable. In high SPL systems a lower number of speakers will be required in order to avoid an excessive voltage drop per run of Cat5 cable. Each zone typically includes three outputs that can drive up to 10 speakers thus allowing 30 or more speakers to be connected in one zone with three separate runs of Cat5 wire. This means that a single Master Control Hub can conceivably power up to 180 speakers in a total network. The manufacturing cost of the Master Control Hub should be less than that of a typical 70 volt stereo power amplifier and will allow several times the number of possible speakers in a large system. Furthermore, by including six separate zones in each Master Control Hub, the professional installer will see considerably lower cost to expand systems for customers who need to add additional zones.

Referring again to FIG. 1, the total network connected to zone 1 block 20 is controlled by a Master zone Level control located on the Master Control Hub and also controlled by Remote Zone Level control 82. As mentioned earlier, this control is very low cost to implement and will not degrade the sonic quality of the system as can happen with typical power attenuators used with 70 volt systems.

Figure 3:
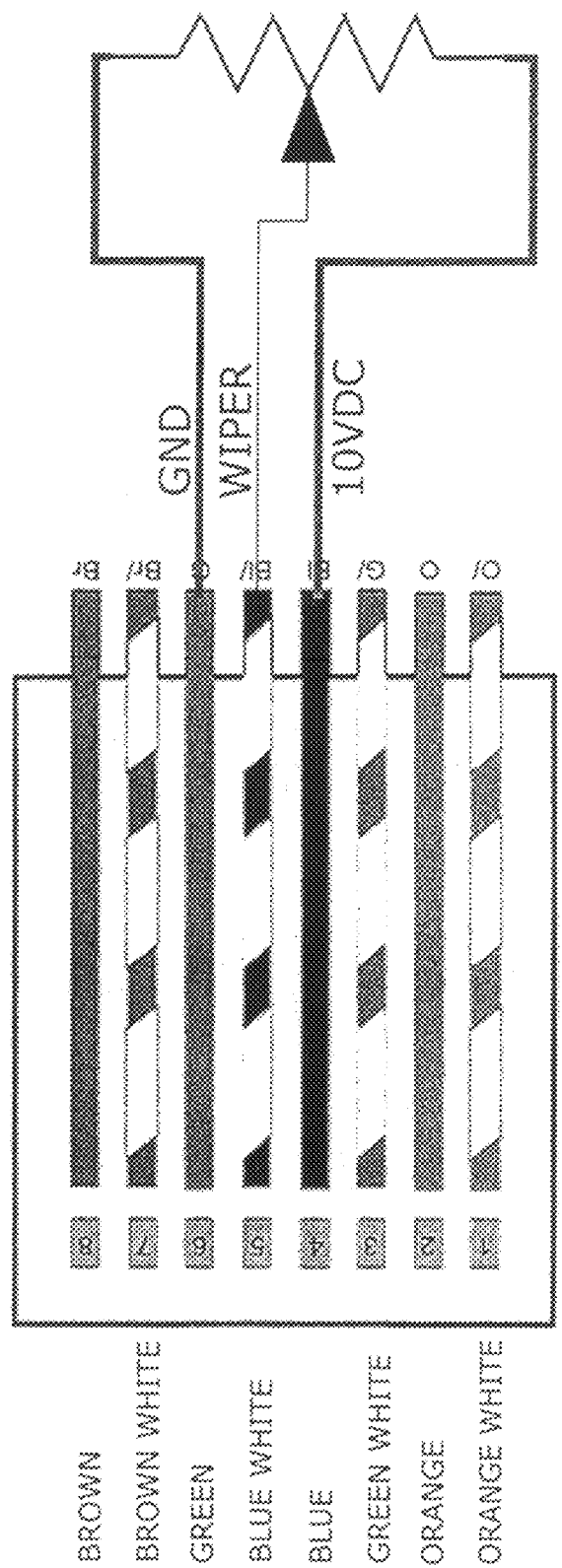
FIG. 3 is a diagram showing the typical connections for use of Cat5 wire between the Master Control Hub and a remotely located volume or level control.
Figure 4:
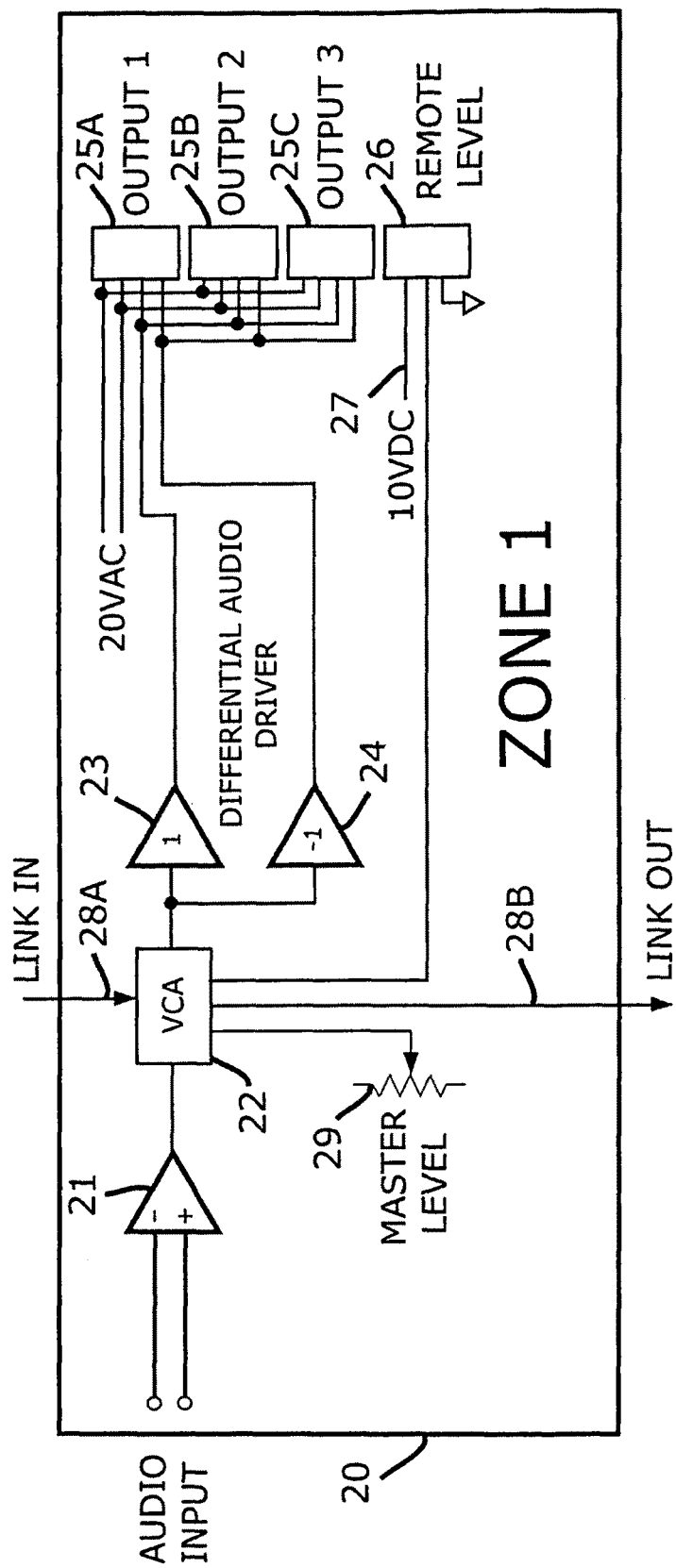
FIG. 4 is a partial block diagram, partial schematic diagram of one zone incorporated in the Master Control Hub.

Referring now to FIG. 4, a detailed description of Zone 1 block 20 contained in the Master Control Hub will be given. A balanced audio signal is applied to the input of differential amplifier 21 and fed to the input of Voltage Controlled Amplifier 22. VCA 22 also receives a link in signal which will disable the Master Level adjustment 29 if the Link In signal 28A is active. A link output signal appears on 28B if zone 1 is set to link with the following zone. The output of VCA 22 feeds differential audio drivers 23 and 24 which will deliver high level audio, typically +10 dbu nominal on the audio output pins of RJ45 connectors 25A, 25B and 25C. As previously noted, 20 VAC is supplied to 3 pair of connections on RJ45 connectors 25A, 25B and 25C to provide power to the externally connected powered speakers. Connector 26 allows connection of an external potentiometer to provide an external DC control for Remote Level control of Zone 1. Internally generated 10 VDC is connected at 27 to RJ45 connector 26 which supplies the required voltage for the external voltage control signal. Referring to FIG. 3, a schematic of the external remote level control is shown.

Figure 5:
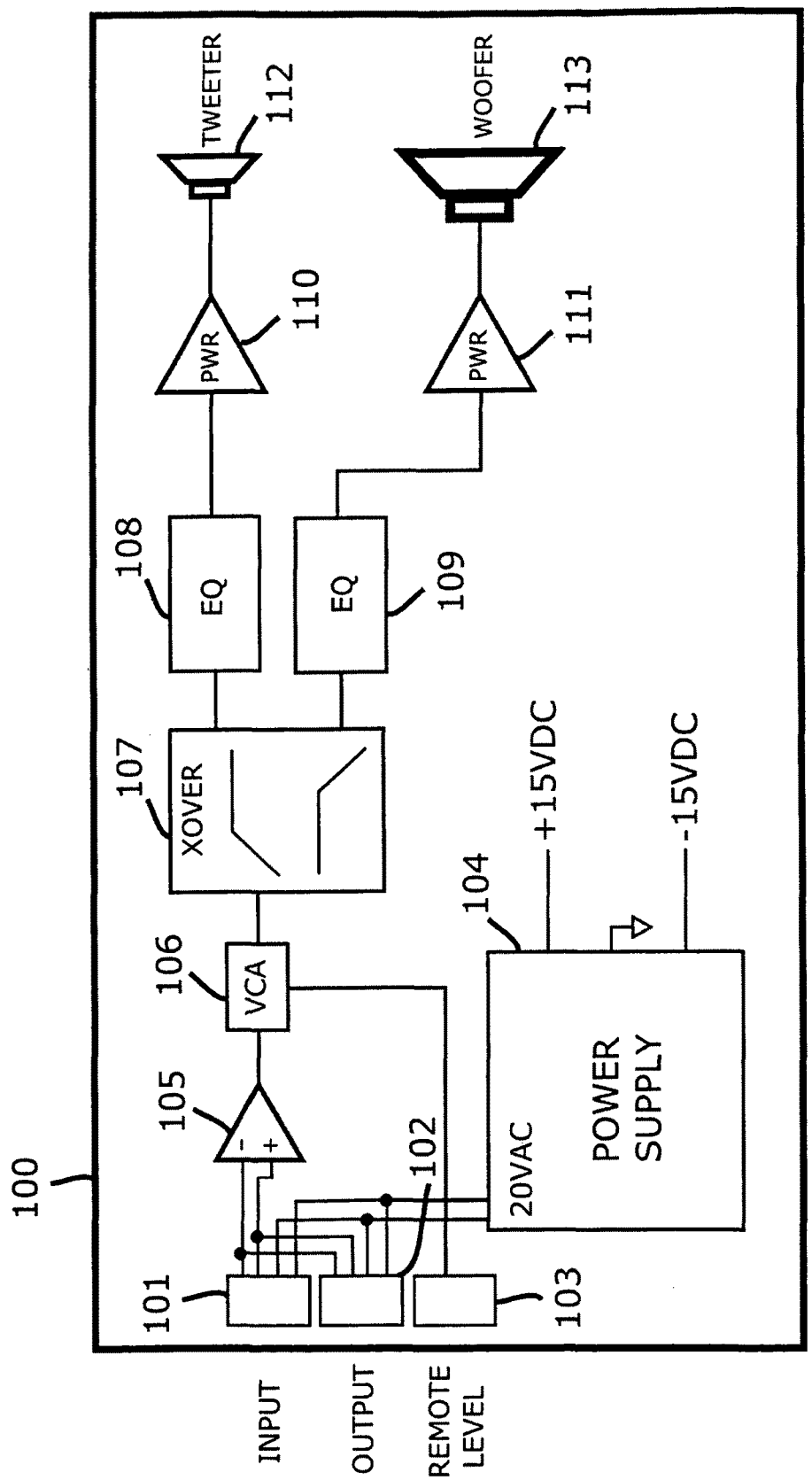
FIG. 5 is a block diagram of a preferred embodiment of the active powered speakers used with the invention.

Referring now to FIG. 5, Powered speaker 100 from FIG. 1 is shown in detail. An input Cat5 cable is connected between Master Control Hub and input connector 101. An output signal is available at connector 102 allowing connection to the next powered speaker in the zone network. An external remote level control can be connected at connector 103 allowing each individual speaker to be additionally controlled if desired. It will be apparent to the skilled artisan that VCA 106 could be omitted and the external remote level control could be via an external potentiometer adjusting the actual audio level of the buffered input signal. 20 VAC is received at connector 101 and fed to the onboard power supply 104 which rectifies the 20 VAC and generates a regulated bipolar 15 VDC power output to power the onboard circuit. High level audio is also fed over the Cat5 cable connected at connector 101 and differential amplifier 105 will cancel any common mode AC that may be induced over a long run of the Cat5 cable. The output of differential amplifier 105 feeds an attenuated signal to the input of VCA 106 allowing remote gain control of the powered speaker. The output of VCA 106 feeds the input of crossover network 107 which allows both low band and high band signals to be processed individually. The outputs of crossover network 107 are connected to the input of equalization circuits 108 and 109 which allows correction equalization to correct for speaker response errors. The outputs of equalization circuits 108 and 109 feed the input of power amplifier circuits 110 and 111 thus providing the required output current to drive woofer 113 and tweeter 112. In order to allow a useful number of speakers via a long run of Category 5 cable, it is extremely important that the current consumption of each active powered speaker be less than 100 milliamps when measured on the 20 VAC output of the Master Control Hub.

A complete schematic diagram of the preferred embodiment of the invention is illustrated in FIGS. 7-17 except that the schematic diagrams for zones 3-6 are identical to the schematic diagram for zone 2.

One of the major advantages of the invention is that the system interconnections can be done with low cost and easy to install Cat5 cable using RJ45 connectors. Virtually all of the commercially available integrated power amplifier chips that can deliver the required output power suffer from excessive quiescent or idle current which greatly reduces the number of powered speakers that can be series connected over long runs of Cat5 cable. As a result, the invention requires the use of a novel power amplifier design that reduces the idle current providing a reduced base line current consumption for each zone. The typical integrated power amplifier circuit is designed with a level of output current bias so as to avoid distortion. This quiescent current for a single power amplifier integrated circuit requires in excess of 170 milliamps of current from the 20 VAC power supplied from the Master Control Hub. This means that a bi-amplified circuit would pull in excess of 300 milliamps idle current even with no audio present. Add the additional current required for the VCA, crossover and equalization, and the idle current becomes a major drawback to using Cat5 cable. Driving the system with multiple speakers and to a level of only 5 watts per speaker would greatly limit, to an unusable level the number of speakers in the system. Even the higher efficiency class D amplifiers require what would be excessive quiescent current consumption.

Figure 6:
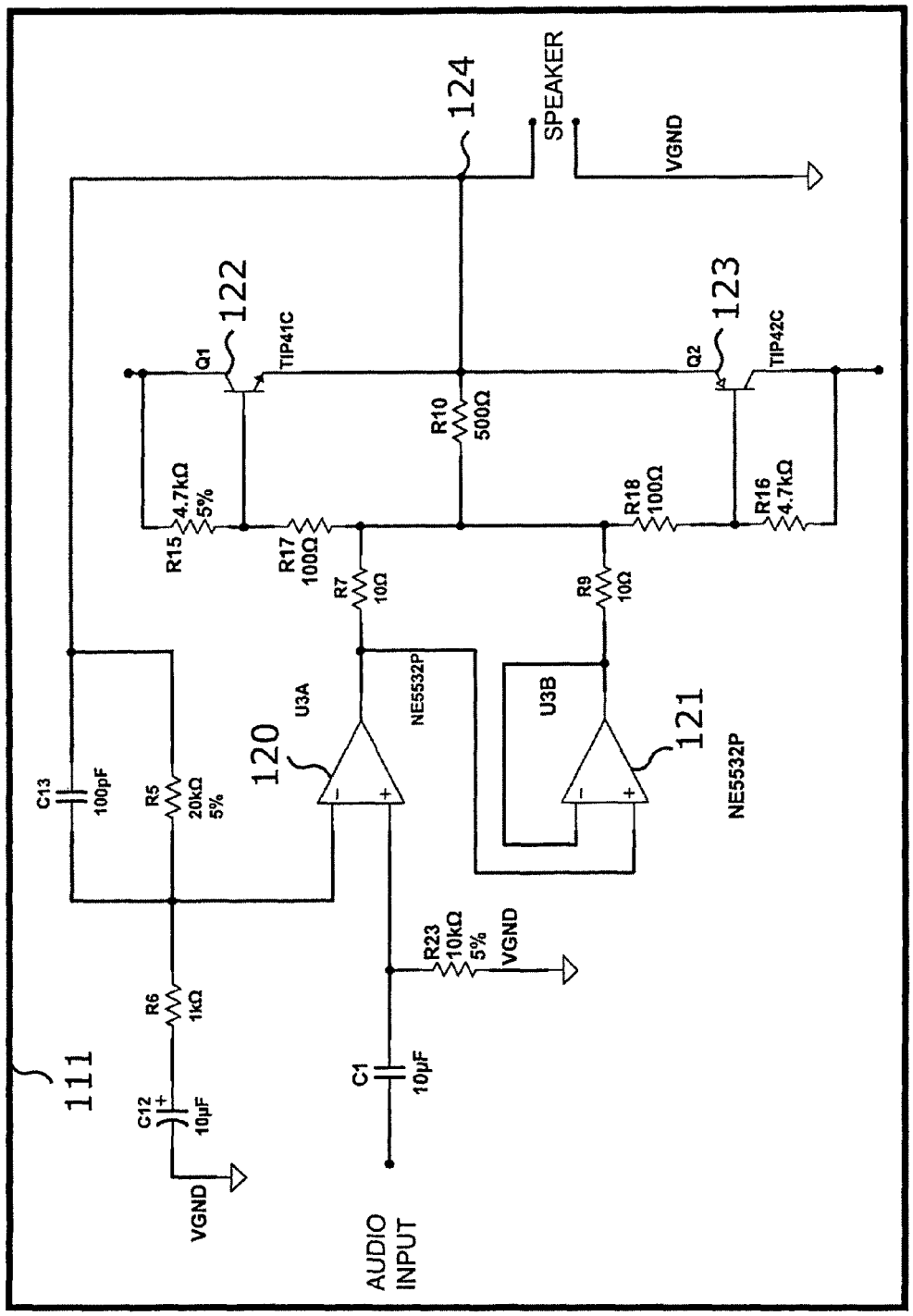
FIG. 6 is a schematic diagram of the novel low current power amplifier used in the active powered speakers.
Figure 7:
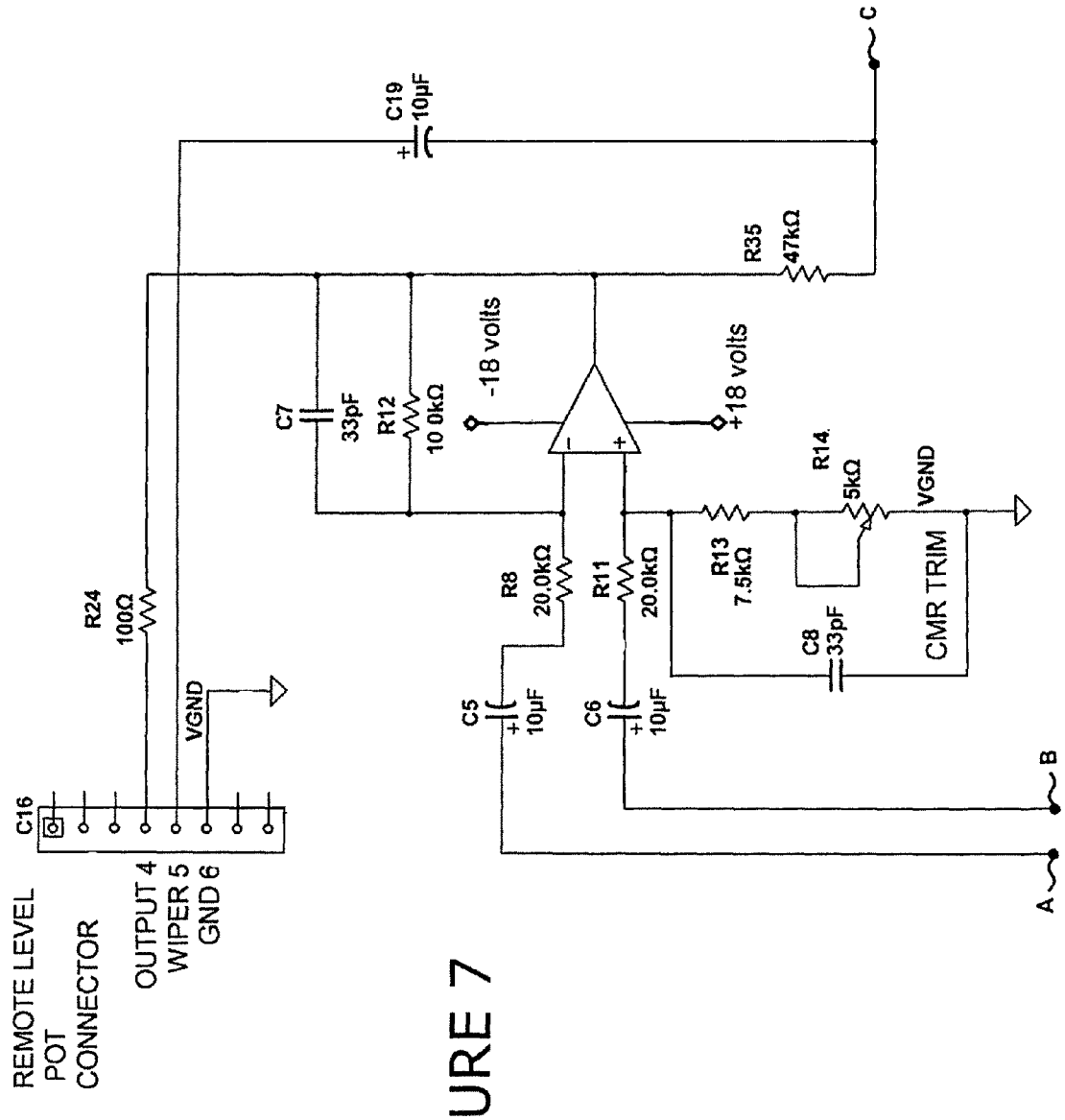
FIG. 7 is a schematic diagram of the input differential amplifier for the amplifier modules of the connected speakers.
Figure 8:
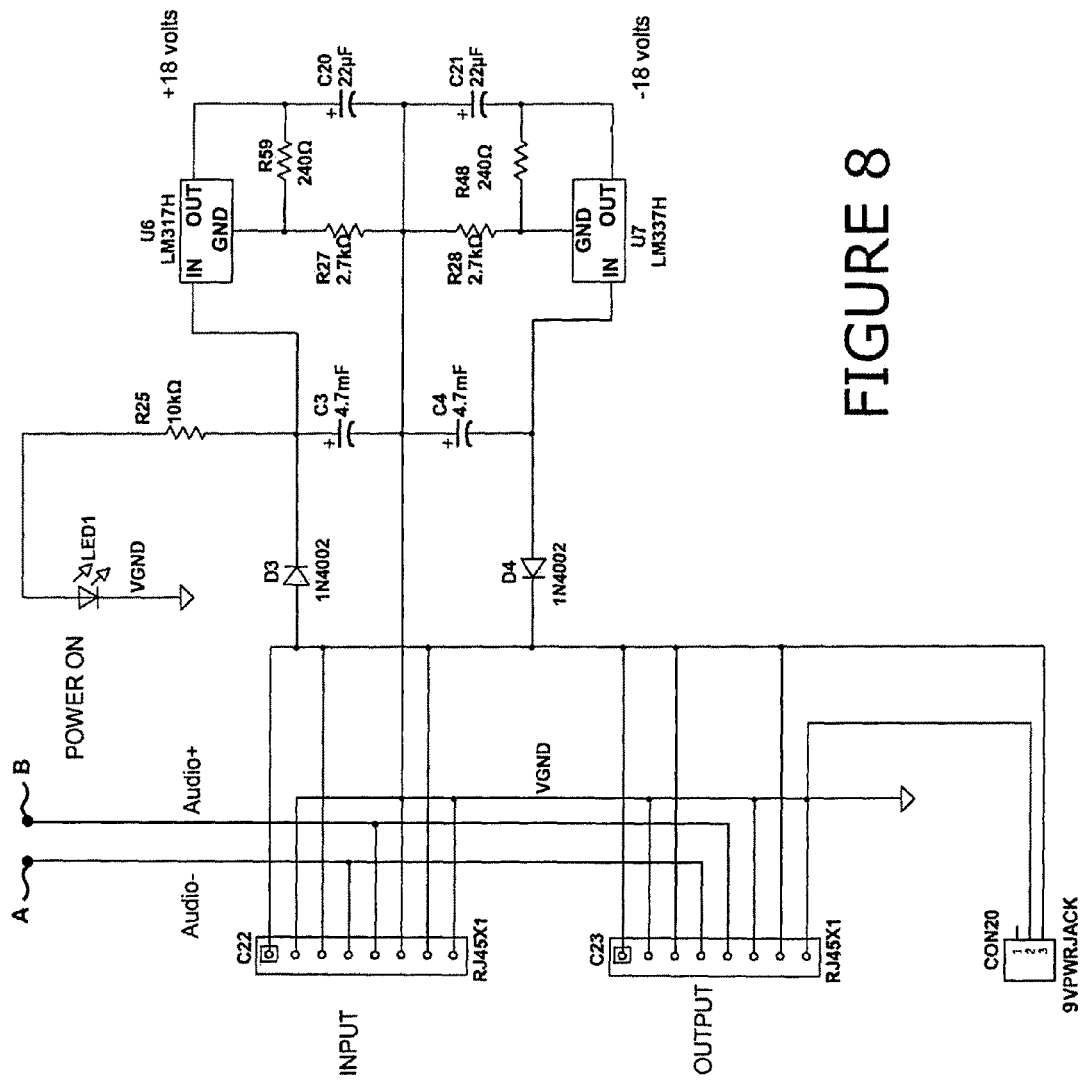
FIG. 8 is a schematic diagram of the power supply for and the main connections in and out of the powered speakers.
Figure 9:
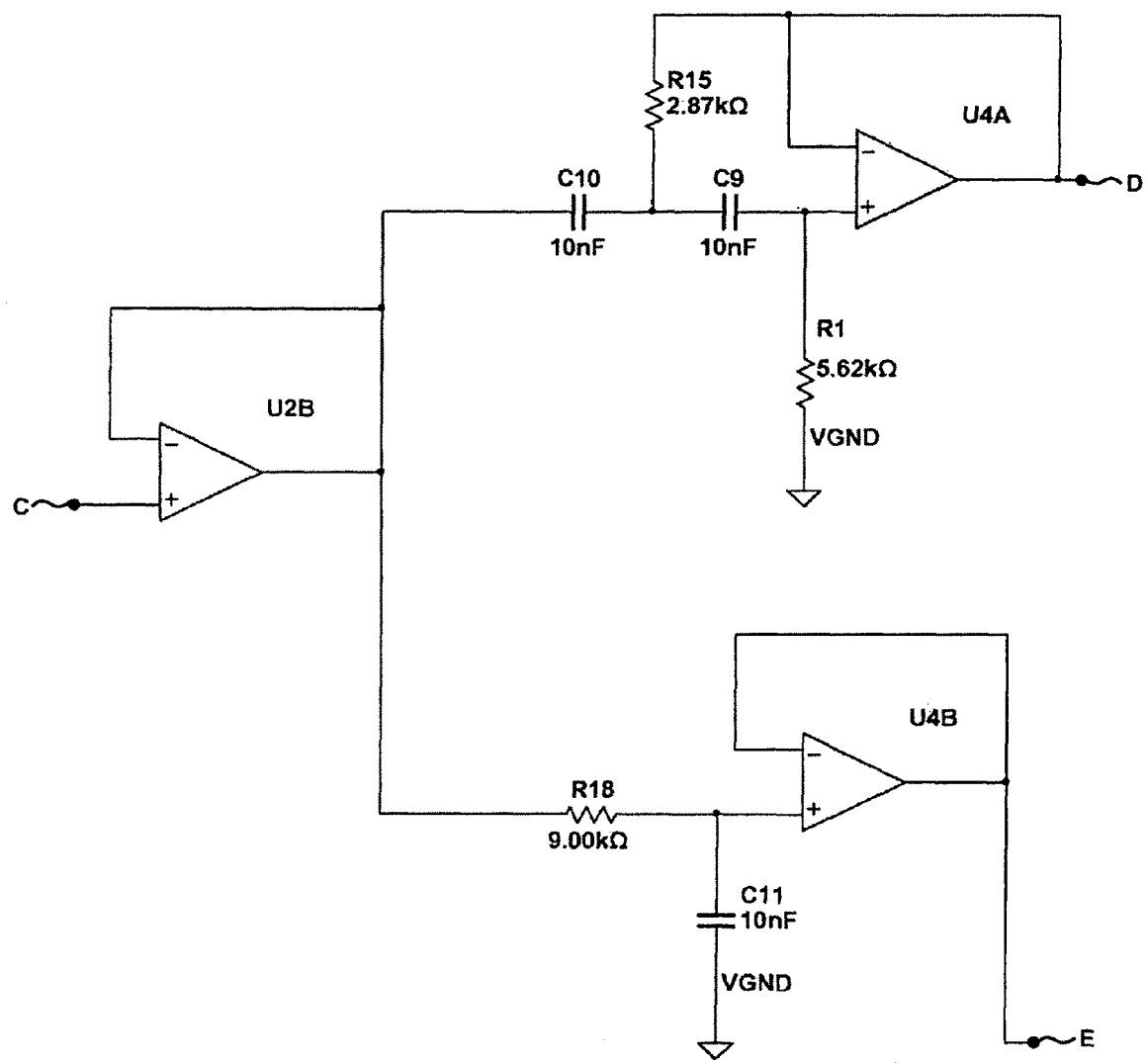
FIG. 9 is a schematic diagram of the crossover network between the woofer and tweeter.
Figure 10:
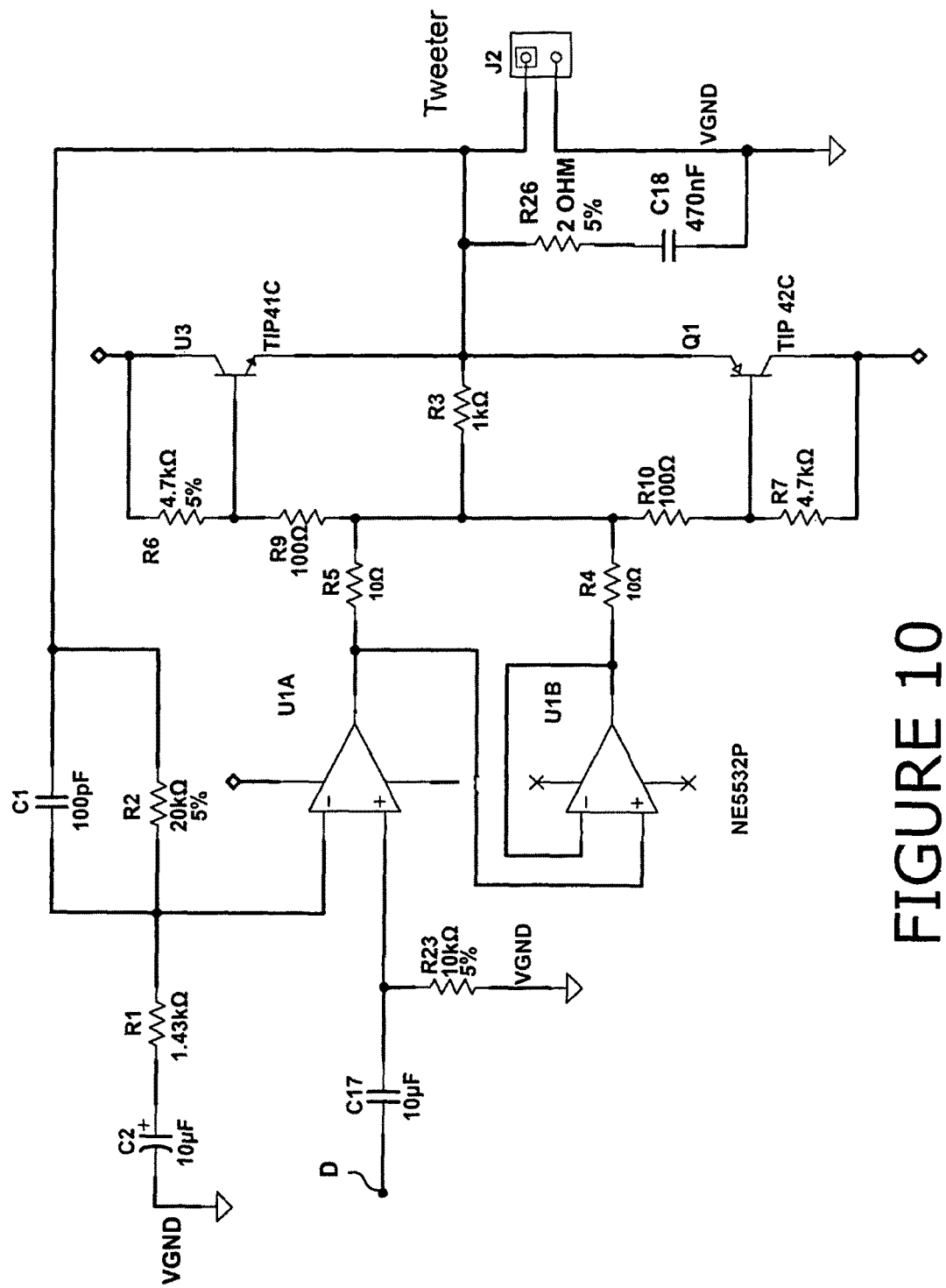
FIG. 10 is a schematic diagram of the low current power amplifier for driving the tweeter.
Figure 11:
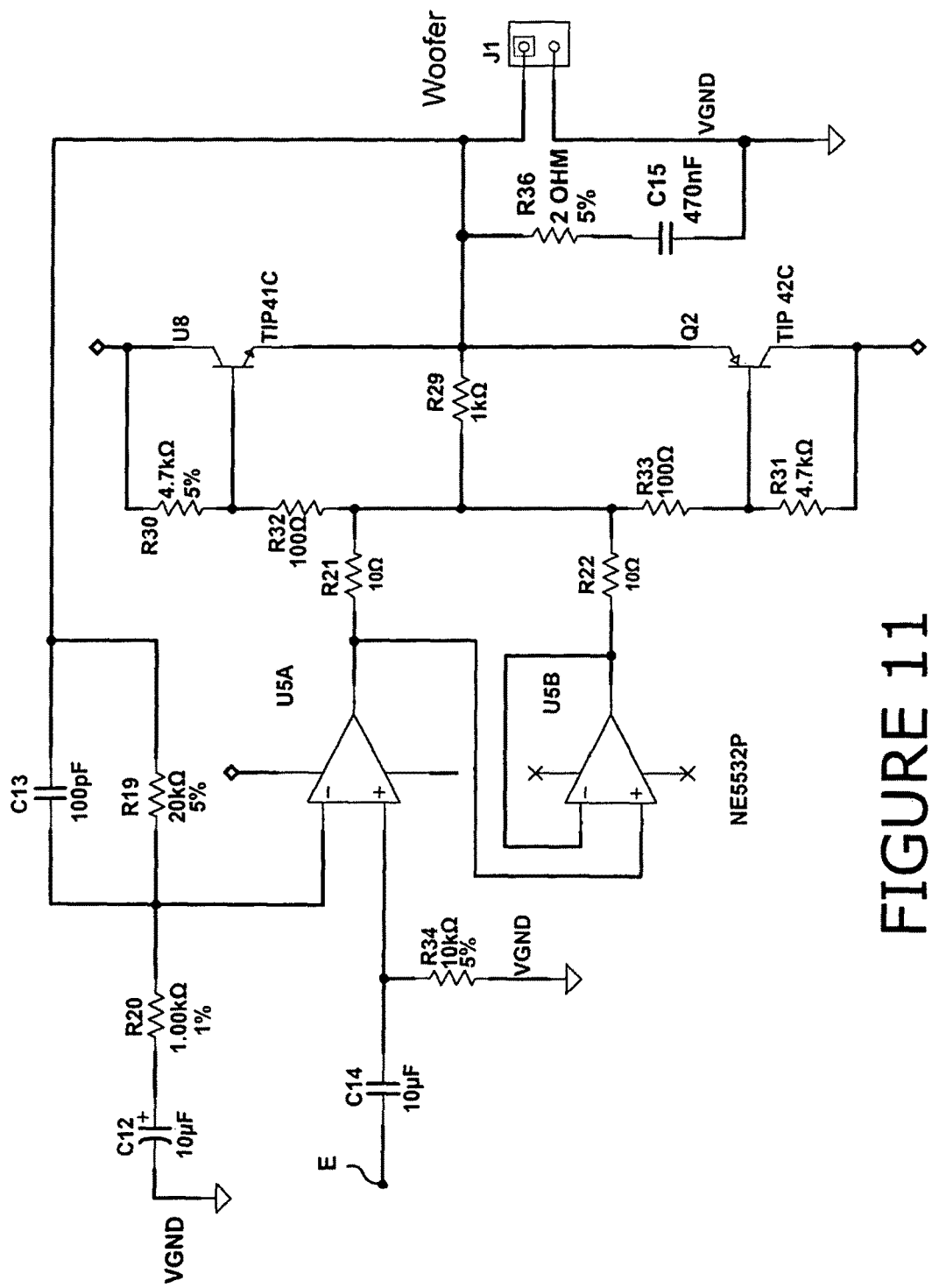
FIG. 11 is a schematic diagram of the low current power amplifier for driving the woofer.
Figure 12A:
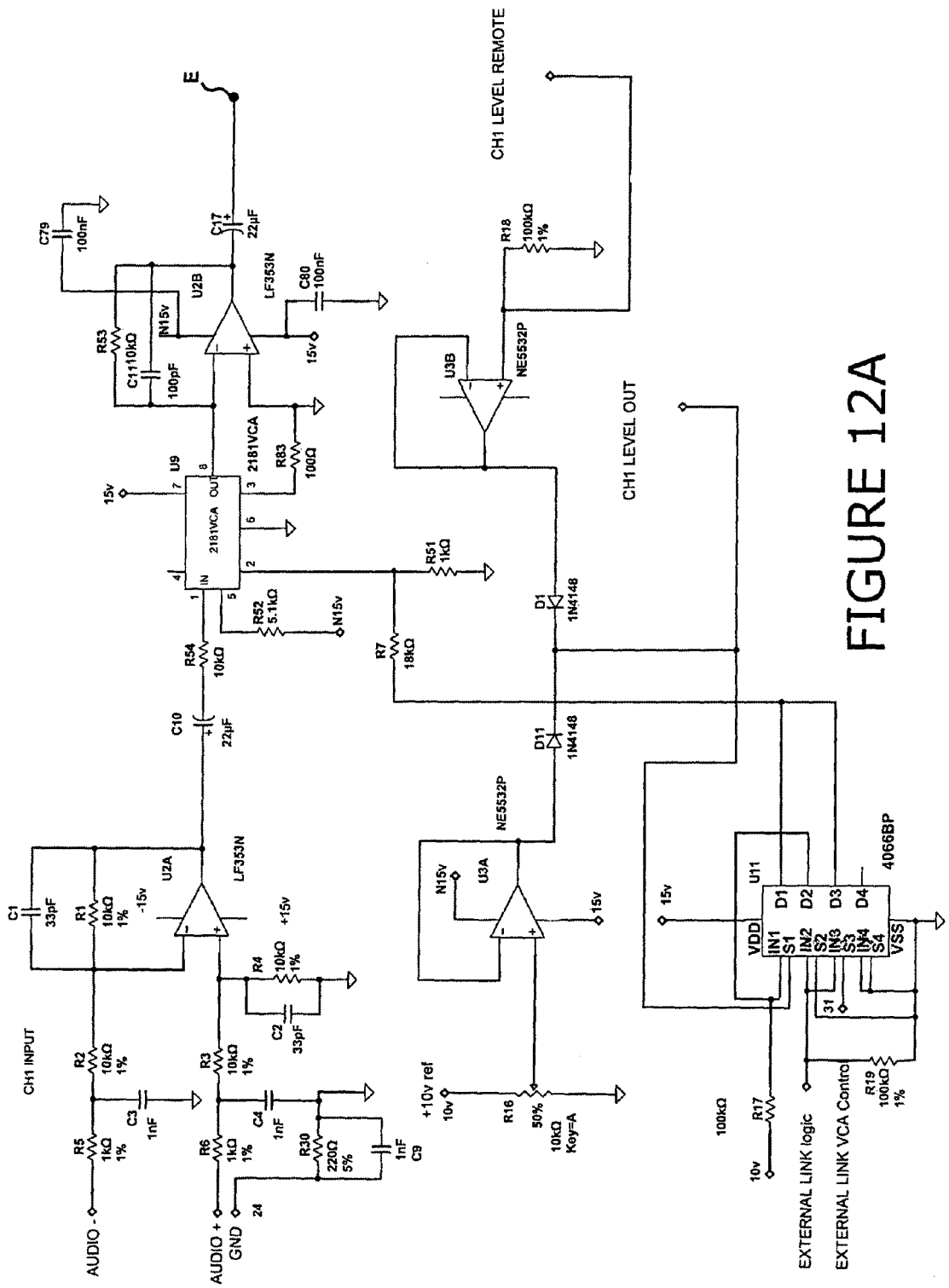
FIG. 12 is a schematic diagram of zone 1 of the master control hub.
Figure 12B:
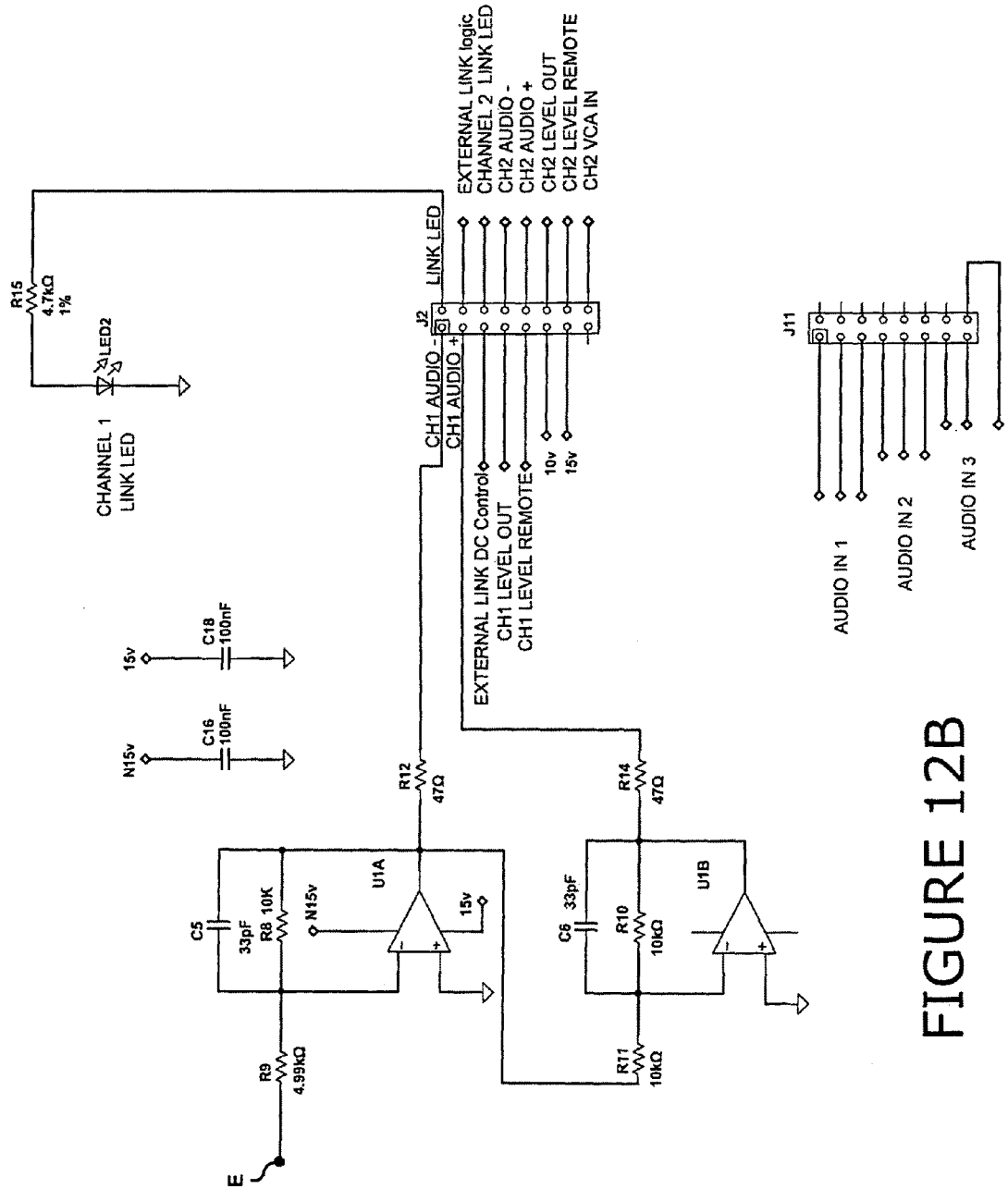
Figure 13A:
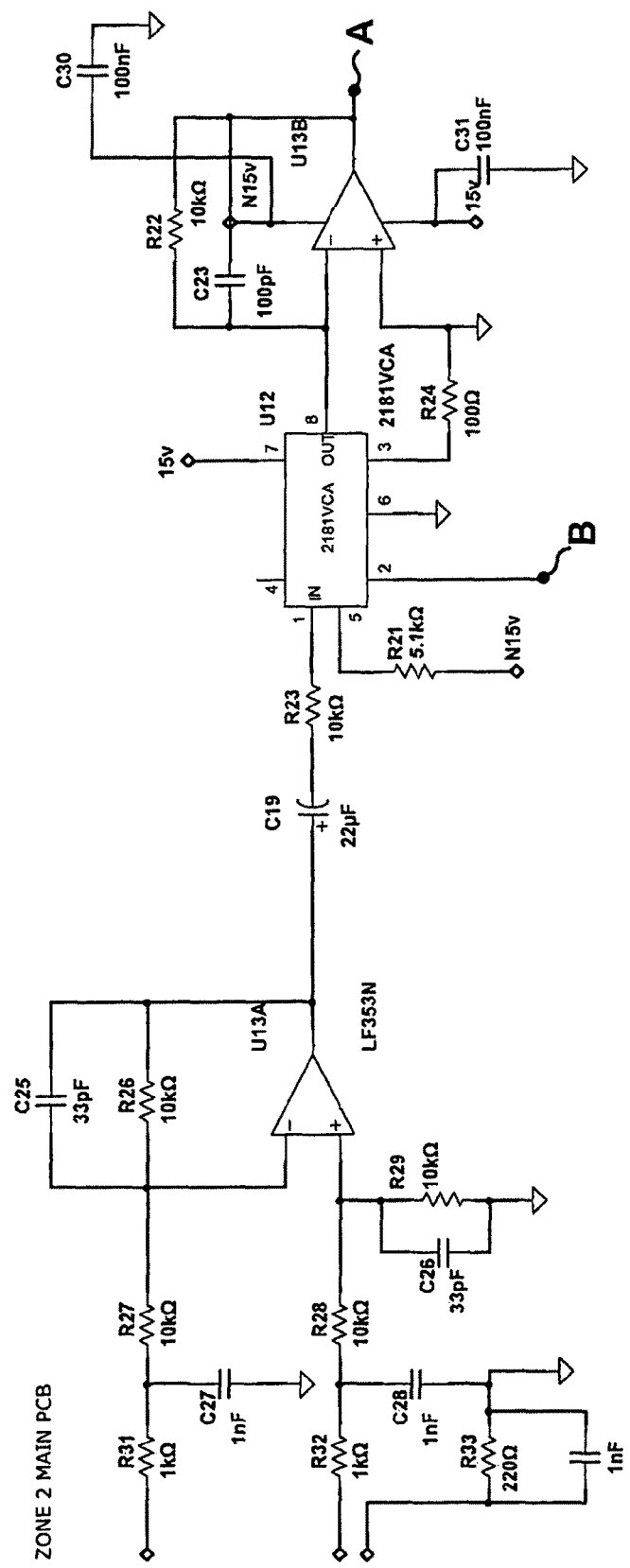
FIG. 13 is a schematic diagram of zone 2 of the master control hub.
Figure 13B:
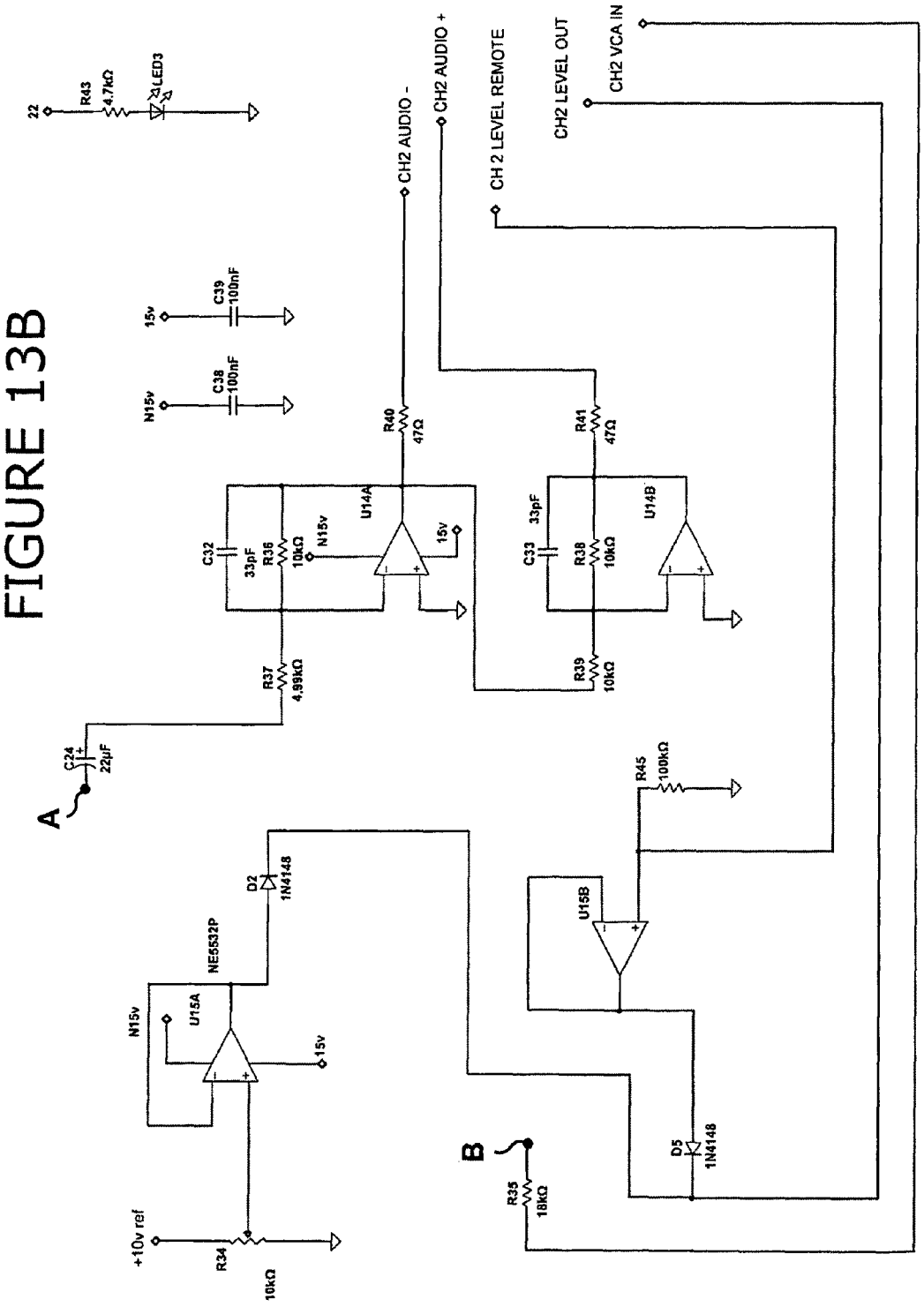
Figure 14:
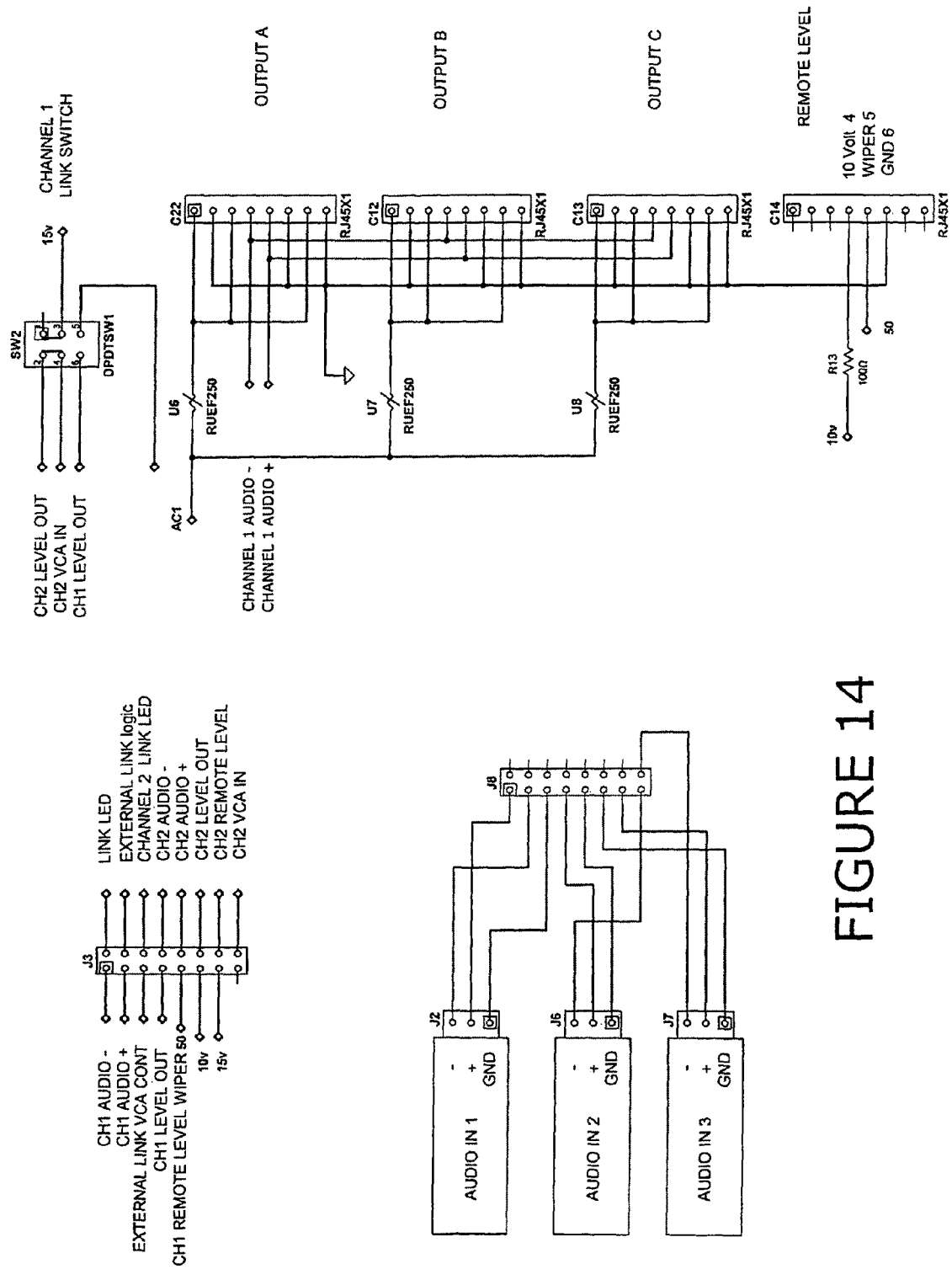
FIG. 14 is a schematic diagram of the inner connections of master control hub diagram of FIG. 12.
Figure 15:
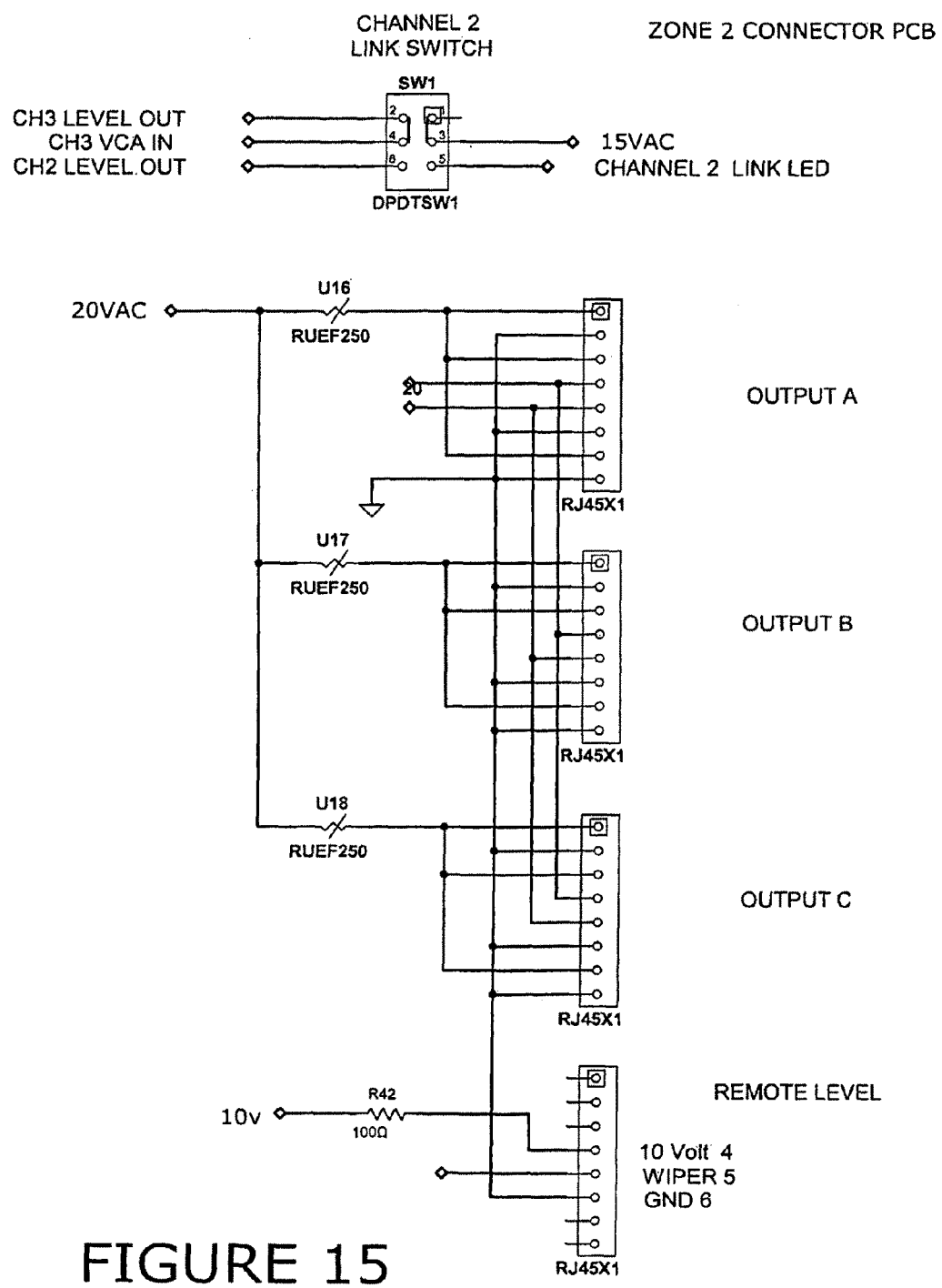
FIG. 15 is a schematic diagram of the inner connections of the zone 2 diagram of FIG. 13.
Figure 16:
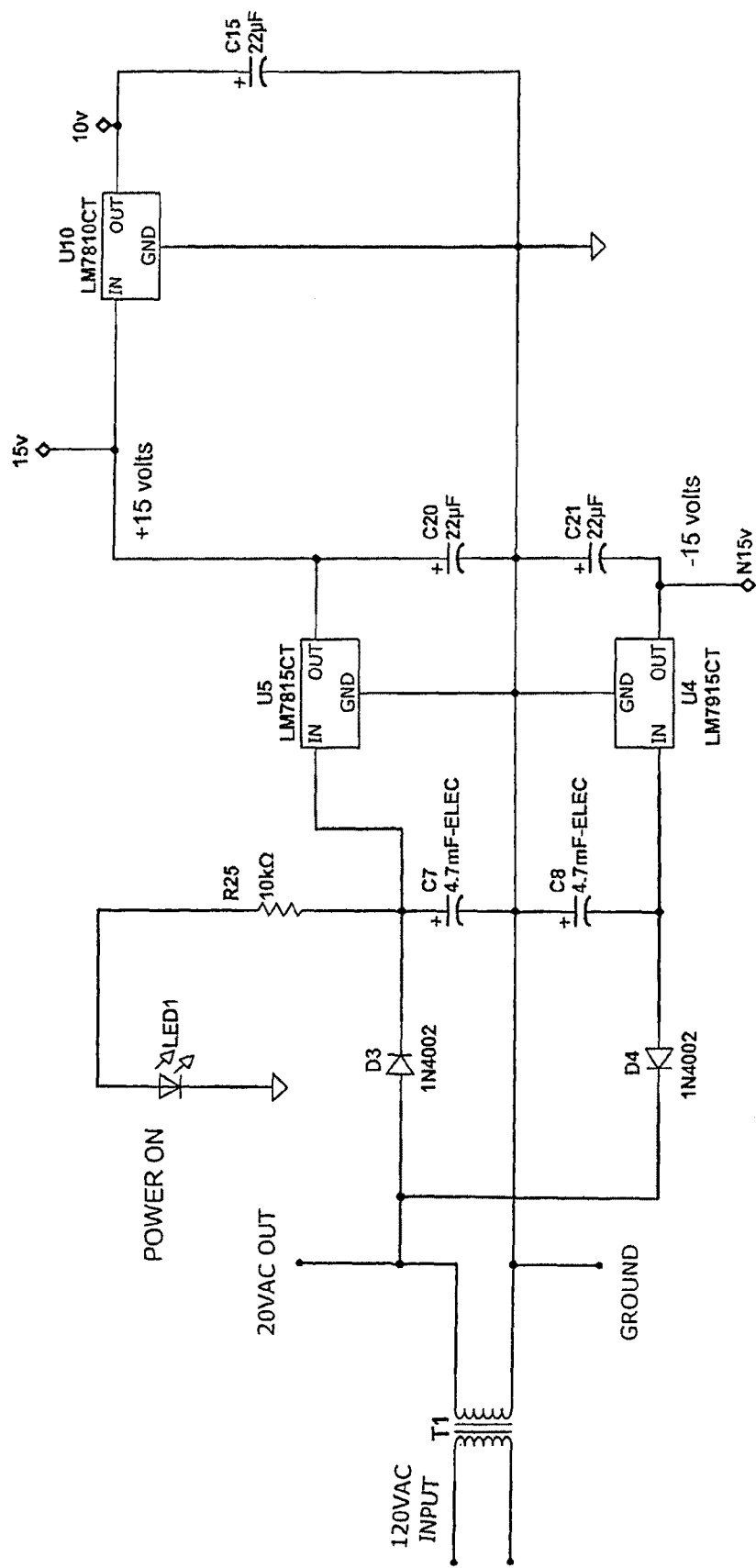
FIG. 16 is a schematic diagram of power supply within the master control hub.
Figure 17:
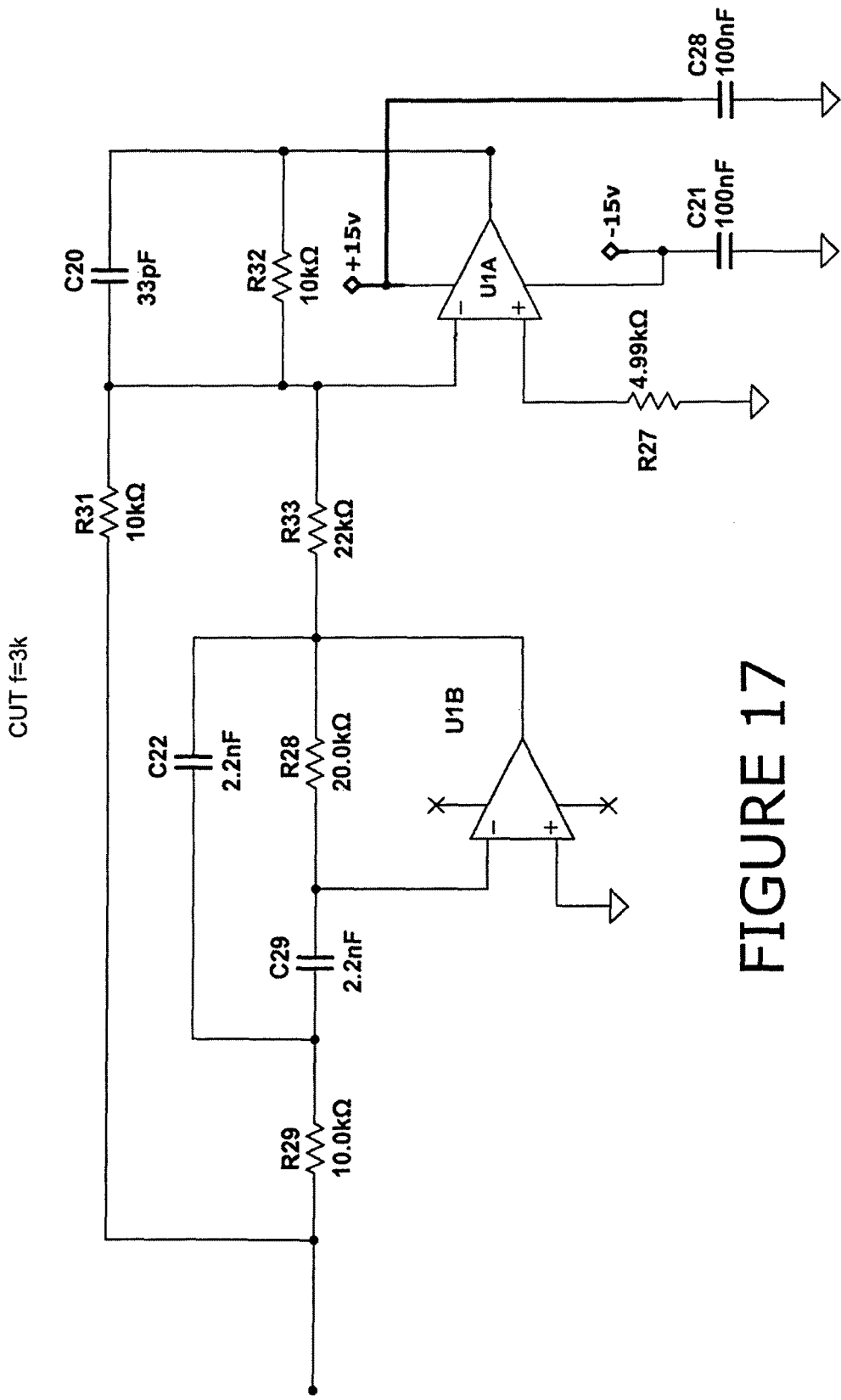
FIG. 17 is a schematic diagram of an equalization circuit for the powered speakers.

As mentioned above, in order to realize the full potential of the invention, a low idle current power amplifier circuit is required and an example of a novel power amplifier design is shown in FIG. 6. This design offers extremely low levels of quiescent current thereby allowing a larger number of speakers to be used in the system. FIG. 6 is a schematic diagram of a preferred embodiment of the power amplifier for use in driving the powered speakers. Most of the concepts of the basic design are clearly illustrated in the 514 patent with the major difference being that the Operational Amplifier used in the circuit is not a monolithic integrated power amplifier, but rather, the design is implemented with use of dual operational amplifiers 120 and 121 sharing the current drive to the base of output transistors 122 and 123. By use of a dual low cost operational amplifier NE5532 the output current delivered to the bases of output transistors 122 and 123 will be sufficient to drive the 8 ohm speaker loads seen from tweeter 112 and woofer 113 in FIG. 5. Referring again to FIG. 6 a Operational Amplifier 120 feeds both resistor R7 and the positive input of Operational Amplifier 121. Ten ohm resistors R7 and R9 allow the outputs of Op Amp 120 and 121 to properly share output current and double the available current drive to the bases of Output transistors 122 and 123. This increase in available drive current is sufficient using an NE5532 Op Amp to allow the amplifier circuit to swing close to the supply limits. At very low output levels, Op Amp 120 and 121, will drive the load directly through resistor R10. When the voltage drop across resistor R10 exceeds approximately 0.1 volts the current flow into the bases of transistor 122 and 123 will be enough to provide current drive from these two output transistors. Resistors R15, R17 R16 and R18 provide enough forward bias to keep transistors 122 and 123 just below turn on which reduces the required voltage drop across resistor R10 to a smaller level before turning on transistors 122 and 123 thereby reducing the distortion of the amplifier circuit to an acceptable level. Overall feedback around the amplifier is provided by resistors R5 and R6. The feedback is taken from the output 124 rather than the output of Op Amp 120 to effectively incorporate the network of transistors 122 and 123 in the feedback loop eliminating most of the distortion components that would be caused by transistors 122 and 123. By providing bias current just below the point of conduction for output transistors 122 and 123 the circuit will have considerably less idle or quiescent current that a conventional integrated power amplifier and is only slightly more than that of the dual Operational Amplifier 120, 121. By using high current output transistors TIP41C and TIP42C for transistors 122 and 123 the circuit will provide output current limiting due to the fact that the Op Amp cannot source enough base current to drive the transistors to reach their maximum collector current. This means that in the case of a defective or shorted speaker the power amplifier will current limit and avoid a destructive condition.

Digital Signal Processing could be utilized to provide all of the variable gain control, crossover and equalization for the invention, if a low power DSP circuit can be realized for use in the powered speakers.

Thus it is apparent that there has been provided, in accordance with the invention, a high definition distributed sound system that fully satisfies the objects, aims and advantages set forth above. While the invention has been described in conjunction with a specific embodiment thereof, it is evident that many alternatives, modifications and variations will be apparent to those skilled in the art and in light of the foregoing description. Accordingly, it is intended to embrace all such alternatives, modifications and variations as fall within the spirit of the invention.

What is claimed is:

1. A high definition distributed sound system comprising:
    a master control hub having a plurality of serially linkable zones;
    at least one serial array of powered speakers;
    a first Cat5 cable;
    one zone of said plurality of serially linkable zones having an audio input, an internal master level controller and at least one powered-speaker output;
    each of said at least one serial array of powered speakers receiving a corresponding one of said at least one powered-speaker outputs as a differential signal via said first Cat5 cable;
    another at least one serial array of powered speakers;
    a second Cat5 cable;
    another of said plurality of serially linkable zones being linked to said one zone, said another of said plurality of serially linkable zones having an audio input, an internal master level controller and at least one powered-speaker output, said internal master level controller of said another of said plurality of serially linkable zones being disabled by linkage to said one zone;
    each of said another at least one serial array of powered speakers being discriminately connected to a corresponding one of said at least one powered-speaker outputs of said another of said plurality of linkable zones by said second Cat5 cable.

2. A high definition distributed sound system according to claim 1 further comprising:
    a remote zone level controller;
    said one zone of said plurality of linkable zones having a remote zone level control input; and
    said remote zone level controller being connected to said remote zone level control input by said first Cat5 cable.

3. A high definition distributed sound system according to claim 1 further comprising:
    a remote zone level controller;
    said one zone of said plurality of linkable zones having a remote zone level control input; and
    said another zone of said plurality of linkable zones having a remote zone level control input;
    said remote zone level controller being connected to said remote zone level control input of said one zone by said first Cat5 cable and to said remote zone level control input of said another zone by said second Cat5 cable.

4. A high definition distributed sound system according to claim 1, said master control hub having a link-in terminal for serial connection of said master control hub to a preceding master control hub and a link-out terminal for serial connection of said master control hub to a following master control hub.

5. A high definition distributed sound system according to claim 1, said master control hub having a link-in terminal for serial connection of said master control hub to a preceding master control hub and a link-out terminal for serial connection of said master control hub to a following master control hub and the system further comprising:
    a remote zone level controller;
    said one zone of said plurality of linkable zones having a remote zone level control input; and
    said another zone of said plurality of linkable zones having a remote zone level control input;
    said remote zone level controller being connected to said remote zone level control input of said one zone by said first Cat5 cable and to said remote zone level control input of said another zone by said second Cat5 cable.

6. A high definition distributed sound system according to claim 1, each said zone in said master control hub being linkable to allow a previous said zone to control a level of a next said zone in said master control hub.

7. A high definition distributed sound system according to claim 1, each of said at least one powered speaker outputs feeding AC power via three twisted pair wires of said Cat5 cable.

8. A high definition distributed sound system according to claim 7, audio being fed differentially down a remaining twisted pair wire of said Cat5 cable at a high level, received by a precision differential amplifier and attenuated before amplification whereby noise intrusion due to feeding AC power via said three twisted pair wires is eliminated.

9. A high definition distributed sound system according to claim 7, said powered speakers converting said AC power to a regulated bipolar DC voltage to power internal active electronics comprising two power amplifiers, one said amplifier driving a woofer and another said amplifier driving a tweeter, in a bi-amplified configuration.

10. A high definition distributed sound system according to claim 9, said powered speakers further comprising a power amplifier consuming extremely low quiescent current, whereby the system is enabled to power several active speakers on each run of said Cat5 cable.

11. A high definition distributed sound system comprising:
    a master control hub having a plurality of serially linkable zones;
    at least one serial array of powered speakers;
    a Cat5 cable;
    one zone of said plurality of serially linkable zones having an audio input, an internal master level controller and at least one powered-speaker output;
    each of said at least one serial array of powered speakers receiving a corresponding one of said at least one powered-speaker outputs as a differential signal via said Cat5 cable; and
    said master control hub having a link-in terminal for serial connection of said master control hub to a preceding master control hub and a link-out terminal for serial connection of said master control hub to a following master control hub.

12. A high definition distributed sound system comprising:
- a master control hub having a plurality of serially linkable zones;
- at least one serial array of powered speakers;
- a Cat5 cable;
- one zone of said plurality of serially linkable zones having an audio input, an internal master level controller and at least one powered-speaker output;
- each of said at least one serial array of powered speakers receiving a corresponding one of said at least one powered-speaker outputs as a differential signal via said Cat5 cable;
- said master control hub having a link-in terminal for serial connection of said master control hub to a preceding master control hub and a link-out terminal for serial connection of said master control hub to a following master control hub;
- a remote zone level controller;
- said one zone of said plurality of linkable zones having a remote zone level control input; and
- said remote zone level controller being connected to said remote zone level control input by said Cat5 cable.

13. A high definition distributed sound system comprising:
- a master control hub having a plurality of serially linkable zones;
- at least one serial array of powered speakers;
- a Cat5 cable;
- one zone of said plurality of serially linkable zones having an audio input, an internal master level controller and at least one powered-speaker output;
- each of said at least one serial array of powered speakers receiving a corresponding one of said at least one powered-speaker outputs as a differential signal via said Cat5 cable;
- at least one other serial array of powered speakers; and
- at least one other Cat5 cable;
- at least one other of said plurality of serially linkable zones being serially linked to said one zone, each of said at least one other of said plurality of serially linkable zones having an audio input, an internal master level controller and at least one powered-speaker output, said internal master level controller of each said another of said plurality of serially linkable zones being disabled by serial linkage to said one zone;
- each of said at least one other serial array of powered speakers being connected to a corresponding one of said at least one powered-speaker outputs of said at least one other of said plurality of linkable zones by a corresponding one of said at least one other Cat5 cables.

14. A high definition distributed sound system according to claim 13 further comprising:
- a remote zone level controller;
- said one zone of said plurality of linkable zones having a remote zone level control input; and
- each of said at least one other zones of said plurality of serially linkable zones having a remote zone level control input;
- said remote zone level controller being connected to said remote zone level control input of said one zone by said Cat5 cable and to said remote zone level control input of each of said at least one other zones by a corresponding one of said at least one other Cat5 cables.

15. A high definition distributed sound system according to claim 13, said master control hub having a link-in terminal for serial connection of said master control hub to a preceding master control hub and a link-out terminal for serial connection of said master control hub to a following master control hub.

16. A high definition distributed sound system according to claim 13, said master control hub having a link-in terminal for serial connection of said master control hub to a preceding master control hub and a link-out terminal for serial connection of said master control hub to a following master control hub and the system further comprising:
- a remote zone level controller;
- said one zone of said plurality of linkable zones having a remote zone level control input; and
- each of said at least one other zones of said plurality of serially linkable zones having a remote zone level control input;
- said remote zone level controller being connected to said remote zone level control input of said one zone by said Cat5 cable and to said remote zone level control input of each of said at least one other zones by a corresponding one of said at least one other Cat5 cables.

* * * * *